(12) United States Patent
Xu et al.

(10) Patent No.: US 9,720,027 B2
(45) Date of Patent: Aug. 1, 2017

(54) FAULT POINT LOCATING METHOD OF HYBRID LINES BASED ON ANALYSIS OF COMPREHENSIVE CHARACTERISTICS OF SINGLE-END ELECTRIC QUANTITY AND TRANSIENT TRAVELLING WAVES

(71) Applicants: State Grid Corporation of China, Beijing (CN); Huainan Power Supply Company of State Grid Anhui Electric Power Corporation, Huainan, Anhui (CN); Nanjing NARI Group Corporation, Nanjing, Jiangsu (CN)

(72) Inventors: Ming Xu, Anhui (CN); Jinming Cheng, Anhui (CN); Peipei Li, Anhui (CN); Ningming Guo, Anhui (CN)

(73) Assignees: State Grid Corporation of China, Beijing (CN); Huainan Power Supply Company of State Grid Anhui Electric Power Corporation, Huainan (CN); Nanjing NARI Group Corporation, Nanjing (CN)

( * ) Notice: Subject to any disclaimer, the term of this patent is extended or adjusted under 35 U.S.C. 154(b) by 0 days.

(21) Appl. No.: 15/114,985

(22) PCT Filed: Aug. 24, 2015

(86) PCT No.: PCT/CN2015/087966
§ 371 (c)(1),
(2) Date: Jul. 28, 2016

(87) PCT Pub. No.: WO2017/024618
PCT Pub. Date: Feb. 16, 2017

(65) Prior Publication Data
US 2017/0089971 A1    Mar. 30, 2017

(30) Foreign Application Priority Data
Aug. 13, 2015 (CN) .......................... 2015 1 0498332

(51) Int. Cl.
*G01R 31/11* (2006.01)
*G01R 31/08* (2006.01)

(52) U.S. Cl.
CPC ............ *G01R 31/11* (2013.01); *G01R 31/085* (2013.01)

(58) Field of Classification Search
CPC ...... G01R 31/11; G01R 31/08; G01R 31/083; G01R 31/085
See application file for complete search history.

(56) References Cited

FOREIGN PATENT DOCUMENTS

CN            104569744 A        4/2015

OTHER PUBLICATIONS

Niazy et al., A New Single Ended Fault Location Algorithm for Combined Transmission Line Considering Fault Clearing Transients Without Using Line Parameters, 2013, Electrical Power and Energy Systems 44, pp. 816-823.*

(Continued)

*Primary Examiner* — Toan Le

(57) ABSTRACT

The invention discloses a fault point locating method of hybrid lines based on analysis of comprehensive characteristics of single-end electric quantity and transient travelling waves, which mainly includes steps: phase-model transformation; looking up initial time of failure; extracting timing window data after the initial time; searching a reflected wave from the fault point and a reflected wave from a demarcation point in the timing window; and judging properties of the reflected waves. After failure of a hybrid line with cable and overhead line, by identifying and comparing comprehensive characteristics of the reflected wave from the fault point, primary and secondary reflected waves from the demarcation point in the single-end transient voltage and current travelling waves, it is rapidly judged whether the fault point is located in the overhead line segment or the cable segment, which is used to assist in switching decision for line reclosing.

6 Claims, 3 Drawing Sheets

(56) References Cited

OTHER PUBLICATIONS

Written Opinion of ISA of PCT/CN2015/087966 issued on May 18, 2016 (in Chinese).
English Translation of Written Opinion of ISA of PCT/CN2015/087966 issued on May 18, 2016.

* cited by examiner

FAULT POINT LOCATING METHOD OF HYBRID LINES BASED ON ANALYSIS OF COMPREHENSIVE CHARACTERISTICS OF SINGLE-END ELECTRIC QUANTITY AND TRANSIENT TRAVELLING WAVES

FIELD OF THE INVENTION

The invention belongs to the field of relay protection of power system, and discloses a fault point locating method of hybrid lines based on analysis of comprehensive characteristics of single-end electric quantity and transient travelling waves.

BACKGROUND OF THE INVENTION

Hybrid line with cable and overhead line is widely used in urban power grid, but it puts forward higher requirements for relay protection and reclosing configuration compared to single overhead line. Because faults of the overhead line are mostly transient faults, insulation could be restored, while faults of the cable are mostly permanent faults, launching of reclosing would lead to a second impact after the failure. In order to ensure cable safety, reclosing in a significant number of hybrid lines with cable and overhead line is not launched, thus transient faults will also lead to long-term power outage of the whole line, which reduces reliability of power supply.

In order to improve reliability and safety of power supply in the hybrid line, reclosing of the hybrid line should possess a self-adaption function, i.e.: reclosing is automatically launched when the fault point is located in the overhead line segment, reclosing is shut down when the cable line fails, and section locating of the hybrid line is the basis of self-adaptive reclosing.

A plurality of research units at home and abroad have carried out the relevant research work in the field of section locating of the hybrid line, and mainly proposed three schemes concerning: travelling wave fault location, distance component as well as installing transformer and protecting device, and the principles are as follows:

(1) Section locating based on travelling wave fault location: travelling wave fault location devices are installed on both sides of the line, the fault point is located through double-end travelling wave fault location, and section locating is realized in conjunction with the line structure.

(2) Reclosing cooperation based on distance component: a protection component is provided between two distances for line protection, one of the distances is set as the cable segment from the bus to the demarcation point, the other one is set as the overhead line segment from the bus to the demarcation point, and fault section is identified through cooperation of different impedance segments.

(3) Section locating by installing transformer and protecting device: a current transformer and an optical-fiber current differential protection are installed at the demarcation point between the cable and the overhead line, when a fault occurs, the differential protection can precisely judge the fault section, thus realizing requirements for shut-down of reclosing for the cable segment fault and switch-on of reclosing for the overhead line segment fault.

At present, the section locating methods of hybrid lines described above are not widely used due to restriction of techniques and costs. The section locating technique of hybrid lines based on a distance component is easy to realize, but it is technically difficult to overcome errors resulting from the transformer and line parameters, and it is greatly influenced by transition resistance. The section locating method of hybrid lines based on travelling wave principles and installed with transformer has the advantage that theoretical precision of algorithms is high, but it needs cooperation of devices at two ends and support of GPS and optical-fiber communication, in one aspect the cost is high, in the other aspect substantially there is no on-site implementation condition for a large number of hybrid lines of medium and low voltage classes. Meanwhile, the section locating method relying on communication cooperation is also difficult to meet time requirement for cooperating with reclosing.

Therefore, the invention provides a fault point locating method of hybrid lines based on analysis of comprehensive characteristics of single-end electric quantity and transient travelling waves.

SUMMARY OF THE INVENTION

An objective of the invention is to provide a fault point locating method of hybrid lines based on analysis of comprehensive characteristics of single-end electric quantity and transient travelling waves. After failure of a hybrid line with cable and overhead line, by identifying and comparing comprehensive characteristics of the reflected wave from the fault point, primary and secondary reflected waves from the demarcation point in the single-end transient voltage and current travelling waves, it is rapidly judged whether the fault point is located in the overhead line segment or the cable segment, which is used to assist in switching decision for line reclosing.

The invention provides a fault point locating method of hybrid lines based on analysis of comprehensive characteristics of single-end electric quantity and transient travelling waves, which mainly includes the following steps:

step 1, performing phase-model transformation based on the single-end electric quantity, and reducing effect of inter-phase coupling of the transient travelling waves on section locating;

step 2, utilizing wavelet transformation to detect a signal break point of transient voltage and current travelling waves as the initial time of failure;

step 3, extracting timing window data after the initial time of failure of the voltage and current travelling waves, wherein size of the timing window is determined by cable length;

step 4, searching all reflected wave heads with the same voltage/current polarity and close amplitudes in the timing window, and computing relative values $u_{xf}$ and $i_{xf}$ of various reflected and initial wave heads with the initial wave head of the voltage/current travelling waves as a benchmark; and step 5, judging properties of the reflected waves.

Further, in step 1: with Clark transformation as a phase-model transformation matrix, obtaining corresponding α modulus in formula (1)

$$i_\alpha(k) = \frac{1}{3}(2 \ast i_A(k) - i_B(k) - i_C(k)) \quad (1),$$

$i_A(k)$, $i_B(k)$ and $i_C(k)$ are respectively the current of the tree phases of A, B and C in the fault line respectively, $i_\alpha(k)$ is α modulus transformed, k=1, 2, 3, 4 ... N, in which N is the length of the sampled sequence represented by a natural number, and a voltage transformation matrix is similar to formula (1).

Further, in step 3, when the cable length is uncertain or wave velocity is not easy to judge, selecting the secondary reflected wave from the demarcation point to assist in computing size of the timing window.

Further, in step 4, both the reflected wave from the fault point and the reflected wave from the demarcation point should satisfy formula (2):

$$u_{xf}/i_{xf} \leq \delta \qquad (2),$$

δ is a fixed value relevant to transient response of a transformer and has a value between 0.5~2.

Further, in step 5, supposing time of an initial fault wave as $T_0$, time of the reflected wave from the fault point as $T_1$, time of the reflected wave from the demarcation point as $T_2$, the cable length as $L_1$, and the cable wave velocity as $v_1$;

when the fault point is located in the overhead line segment, the condition of the following formula (3) is satisfied:

$$T_1 - T_0 = T_2 - T_0 \qquad (3);$$

when the fault point is located in the cable segment, the condition of the following formula (4) is satisfied:

$$(T_1 + T_2 - 2T_0) * v_1 = L_1 \qquad (4).$$

Further, in step 5, when there are the following two cases, step 6 needs to be performed:

1) when the fault point is close to a bus or the demarcation point, the reflected wave from the fault point or the reflected wave from the demarcation point may be overlapped with an initial fault travelling wave or the secondary reflected wave from the demarcation point;

2) when the fault is high resistance fault or metallic fault, only one of the reflected wave from the fault point and the reflected wave from the demarcation point can be identified;

Step 6: judging whether the amplitude of the secondary reflected wave from the demarcation point is out of limit.

Further, in step 6, taking whether difference value between the amplitudes of the secondary reflected waves from the voltage/current demarcation points is out of limit as identification criterion, and supposing the amplitudes of the secondary reflected waves from the demarcation points as $C_u$ and $C_i$, and the set difference value between the amplitudes of the secondary reflected waves from the demarcation points as $\delta_u$ and $\delta_i$, the condition of the following formula (5) is satisfied:

$$u_{xf2} - C_u > \delta_u, i_{xf2} - C_i > \delta_i \qquad (5).$$

Compared to the existing section locating methods of hybrid lines, the fault point locating method of hybrid lines based on analysis of comprehensive characteristics of single-end electric quantity and transient travelling waves provided by the invention has the following advantages:

(1) lower cost and higher feasibility. The method described in the invention is based on detection and comparison of single-end electric quantity, has low requirements for hardware conditions, performs signal sampling by directly utilizing existing transformer without support of GPS and communication channels, and possesses better engineering feasibility.

(2) low data requirement, simple algorithmic logic and better speedability. The method described in the invention is based on data of single-end electric quantity of the hybrid lines, does not need support of both-end data, and can complete section locating only with short data (within 1 ms) after the initial time of failure, has simple algorithmic logic, and relative to existing algorithm relying on both-end data or power frequency quantity of the line, can completely meet time requirement for cooperating with reclosing.

(3) wide scope of application and excellent reliability. Because only amplitude and polarity of the reflected waves within the timing window are detected, these characteristics are irrelevant to branch line and cable positions; meanwhile, transient voltage and current travelling waves show great differences at the end of branch line and the end of adjacent line, interference factors such as the branch line have no influence on calculation of the method described in the invention.

In order to clearly illustrate technical schemes in examples of the invention or in the prior art, drawings to be used in description of the examples or the prior art will be simply introduced below, obviously, the drawings in following description are some examples of the invention, and for those skilled in the art, other drawings could be obtained according to these drawings without creative efforts.

DETAILED DESCRIPTION OF THE INVENTION

In order to make objectives, technical schemes and advantages of the invention clearer, technical schemes in the examples of the invention will be described clearly and fully below in conjunction with drawings in the examples of the invention, and it is evident that the described examples are some of examples of the invention, but not all examples. All other examples obtained by those skilled in the art without creative efforts based on examples of the invention will fall within the protection scope of the invention.

The method described in the invention is applicable to the hybrid line with overhead line and a single segment of cable.

The invention employs relative value analysis, which facilitates amplitude comparison of voltage and current travelling waves, and the amplitudes described below are all relative values.

Figure 1:
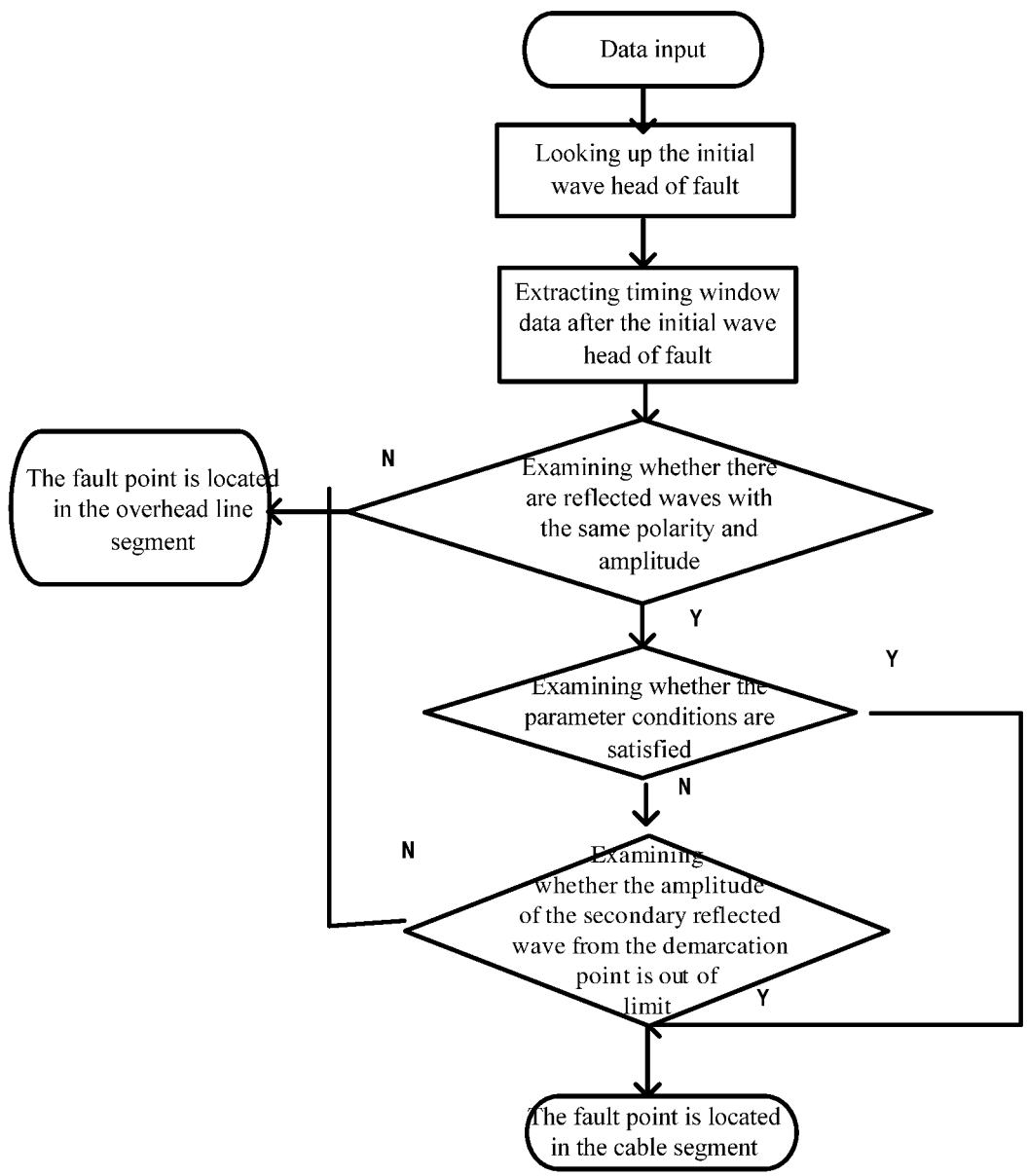
FIG. 1: an overall flow chart of algorithm of the invention.

Referring to FIG. 1, the invention provides a fault point locating method of hybrid lines based on analysis of comprehensive characteristics of single-end electric quantity and transient travelling waves, which mainly includes the following steps:

step 1: phase-model transformation.

Because transient travelling waves present coupling during transmission, so phase-model transformation is performed based on the single-end electric quantity, and effect of inter-phase coupling on section locating is reduced. With Clark transformation as a phase-model transformation matrix in the invention, corresponding α modulus in formula (1) is obtained $$i_\alpha(k) = \frac{1}{3}(2 * i_A(k) - i_B(k) - i_C(k)) \qquad (1),$$

in formula (1), $i_A(k)$, $i_B(k)$ and $i_C(k)$ are respectively the current of the tree phases of A, B and C in the fault line, $i_\alpha(k)$ is α modulus transformed, k=1, 2, 3, 4 . . . N, in which N is the length of the sampled sequence represented by a natural number, and a voltage transformation matrix is similar to formula (1).

Step 2: looking up initial time of failure.

Utilizing wavelet transformation to detect a signal break point of transient voltage and current travelling waves as the initial time of failure.

Step 3: extracting timing window data after the initial time.

Extracting timing window data after the initial time of failure of the voltage and current travelling waves, wherein size of the timing window is determined by cable length (even with a long submarine cable, the timing window is less than 1 ms in most cases), when the cable length is uncertain or wave velocity is not easy to judge, selecting the secondary reflected wave from the demarcation point to assist in computing size of the timing window.

Step 4: searching a reflected wave from the fault point and a reflected wave from a demarcation point in the timing window.

Searching all reflected wave heads with the same voltage/current polarity and close amplitudes in the timing window, and computing relative values of various reflected and initial wave heads ($u_{xf}$ and $i_{xf}$, respectively) with the initial wave head of the voltage/current travelling waves as a benchmark, wherein both the reflected wave from the fault point and the reflected wave from a demarcation point should satisfy:

$$u_{xf}/i_{xf} < \delta \qquad (2),$$

$\delta$ is a fixed value relevant to transient response of a transformer, has a value between 0.5~2 approximately, and can be obtained according to test or historical value.

Step 5: judging properties of the reflected waves.

When the fault point is located in the overhead line segment far away from the demarcation point, there is only the secondary reflected wave from the demarcation point in the timing window, but when the fault point is close to the demarcation point between the cable and the overhead line (namely the distance is 1.9-fold shorter than the cable length), there may be the primary/secondary reflected waves from the demarcation point and the fault point, supposing time of an initial fault wave as $T_0$, time of the primary reflected wave from the fault point as $T_1$, time of the primary reflected wave from the demarcation point as $T_2$, the condition of the following formula (3) is satisfied:

$$T_1 - T_0 = T_2 - T_0 \qquad (3),$$

and in most cases there is a third reflected wave.

When the fault point is located in the cable segment far away from the bus or the demarcation point, in most cases, the reflected wave from the fault point and the reflected wave from the demarcation point can be searched in the timing window, and the reflected wave from the fault point and the reflected wave from the demarcation point accord with restriction of the cable length. Supposing time of an initial fault wave as $T_0$, time of the reflected wave from the fault point as $T_1$, time of the reflected wave from the demarcation point as $T_2$, the cable length as $L_1$, and the cable wave velocity as $v_1$, the condition of the following formula (4) is satisfied:

$$(T_1 + T_2 - 2T_0) * v_1 = L_1 \qquad (4).$$

But in the following cases, it needs to further identify through step 6, 1) when the fault point is close to a bus or the demarcation point, the reflected wave from the fault point or the reflected wave from the demarcation point may be overlapped with an initial fault travelling wave or the secondary reflected wave from the demarcation point.

2) when fault transition resistance is slightly high (resistance fault) or slightly low (metallic fault), only one of the reflected wave from the fault point and the reflected wave from the demarcation point can be identified.

Step 6: judging whether the amplitude of the secondary reflected wave from the demarcation point is out of limit.

In most cases of the overhead line failure, amplitude of the secondary reflected wave from the demarcation point is close to a fixed value, and the fixed value can be obtained from historical data or based on characteristic impedance, and is supposed as $C_u$ and $C_i$. In the two cases described in step 5, when the fault point is close to a bus or the demarcation point, amplitude of the secondary reflected wave from the demarcation point will be significantly changed due to refraction and reflection back and forth; when the fault transition resistance is slightly high or slightly low, amplitude of the secondary reflected wave from the demarcation point will also be significantly changed due to effect of the transition resistance. Assuming the set difference value between the amplitudes of the secondary reflected waves from the demarcation points as $\delta_u$ and $\delta_i$, the condition of the following formula (5) is satisfied:

$$u_{xf2} - C_u > \delta_u, i_{xf2} - C_i > \delta_i \qquad (5),$$

and as shown in formula (5), whether difference value between the amplitudes of the secondary reflected waves from the voltage/current demarcation points is out of limit is taken as identification criterion in the invention.

The invention performs rapid section locating by comparing polarity, amplitude and time of reflected waves of voltage and current within the timing window after the failure. Principles of the invention will be illustrated below in details in conjunction with FIGS. 2a and 2b.

Figure 2A:
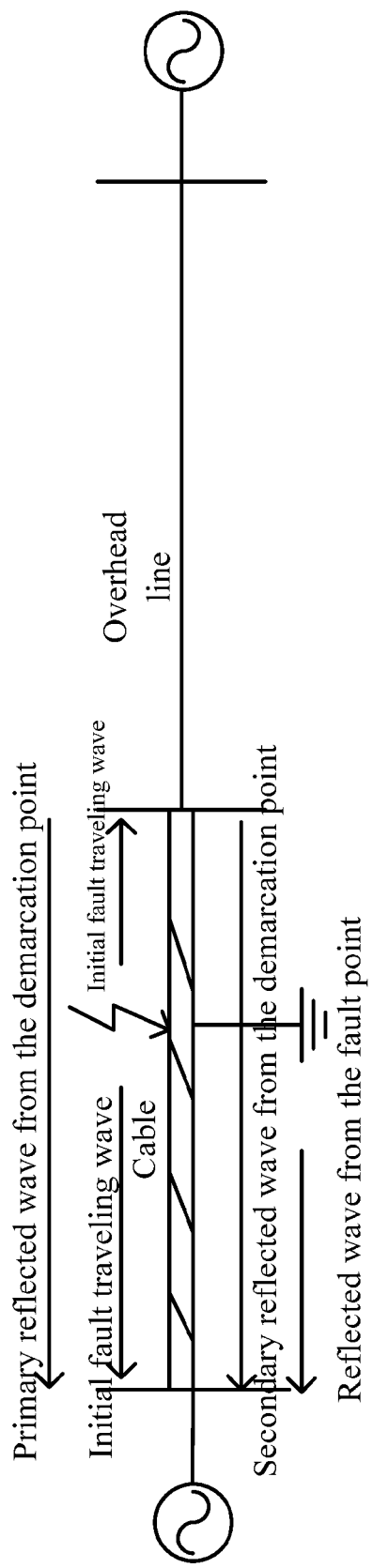
FIG. 2a-2b: comparative schematic diagram of reflected waves when the fault points of the hybrid line are located at different locations, wherein in FIG. 2a, the fault point is located in the cable segment, and in FIG. 2b, the fault point is located in the overhead line segment.
Figure 2B:
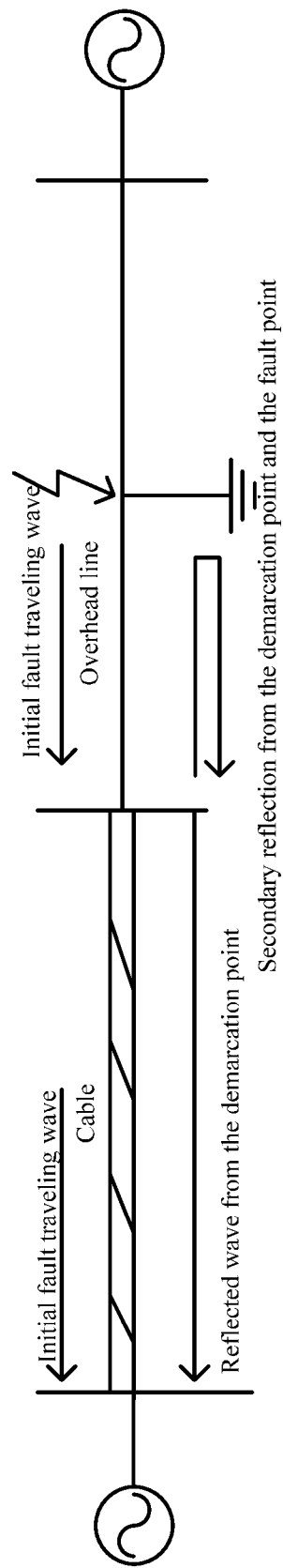

As shown in FIGS. 2a and 2b, when the fault point is located in different line segments, fundamental principles of the locating method of the invention are as follows:

(1) the fault point is located in the cable segment.

If the fault point is located in the cable segment, the cable length is set as $L_1$, and the wave velocity of the cable is set as $v_1$, there should be three types of reflected waves within the timing window ($2 \times L_1/v_1$) after the initial wave head of fault:

1) the reflected wave produced after the initial fault travelling wave arrives at the demarcation point, which is called the reflected wave from the demarcation point for short;

2) the travelling wave produced after the initial fault travelling wave arrives at the bus end and is reflected, and the reflected wave returns to the fault point and is reflected again, which is called the reflected wave from the fault point for short;

3) the travelling wave produced after the initial fault travelling wave arrives at the bus end and is reflected, and the reflected wave is refracted through the fault point, arrives at the demarcation point and is reflected again, which is called the secondary reflected wave from the demarcation point for short.

(2) the fault point is located in the overhead line segment.

If the fault point is located in the overhead line segment, there is only the secondary reflected wave from the demarcation point in the timing window after the initial wave head of fault, and when the fault point is close to the demarcation point (namely the distance is 1.9-fold shorter than the length of the cable segment), there may be the primary/secondary reflected waves from the demarcation point and the fault point.

If the initial voltage/current travelling wave is used as a benchmark, $\beta_{u0}$, $\beta_{u1}$ and $\beta_{u2}$ are respectively voltage reflection coefficients of the bus end, the fault point and the demarcation point; $\beta_{i0}$, $\beta_{i1}$ and $\beta_{i2}$ are respectively current reflection coefficients of the bus end, the fault point and the demarcation point; and $\alpha_{i0}$ and $\alpha_{u1}$ are respectively voltage and current refraction coefficient of the fault point. Because voltage and current reflection coefficients have equal amplitude and opposite polarities, the refraction coefficient is the same.

When the initial voltage/current travelling wave is used as a benchmark, basic characteristics of various types of reflected waves are as follows:

(1) when the fault point is located in the cable segment
  1) relative values of the voltage/current reflected waves from the fault point:

$$u_{xf0}=\beta_{u0}\beta_{u1}, i_{xf0}=\beta_{i0}\beta_{i1} \quad (6).$$

The voltage/current reflected waves from the fault point have the same polarities, both are positive polarity reflection, and have similar amplitudes and essentially same locations, and amplitudes of the reflected waves are relevant to transition resistance. The invention employs relative value analysis, which facilitates amplitude comparison of voltages and current travelling wave, and the amplitudes described hereafter are all relative values.

2) relative values of the voltage/current reflected waves from the demarcation point:

$$u_{xf1}=-\alpha_{u1}\beta_{u2}, i_{xf1}=-\alpha_{i1}\beta_{i2} \quad (7).$$

Because the initial voltage and current travelling waves are opposite, the voltage and current reflected waves from the demarcation point have the same polarities, both are positive polarity reflection, and have similar amplitudes and essentially same locations, and amplitudes of the reflected waves are relevant to transition resistance and characteristic impedance (between 260-500 ohms for the overhead line, and between 100-160 ohms for the cable).

3) relative values of the secondary voltage/current reflected waves from the demarcation point:

$$u_{xf2}=\alpha_{u1}\alpha_{u1}\beta_{u0}\beta_{u2}, i_{xf2}=\alpha_{i1}\alpha_{i1}\beta_{i0}\beta_{i2} \quad (8).$$

The secondary voltage/current reflected waves from the demarcation point have the same polarities, both are negative polarity reflection, occur at the same time essentially and are relevant to the cable length, and are relevant to transition resistance and characteristic impedance in amplitude, and because the secondary reflected waves from the demarcation point pass through the fault point two times, the amplitudes are greatly influenced by the transition resistance.

(2) when the fault point is located in the overhead line segment.
  1) relative values of the primary voltage/current reflected waves from the fault point and the demarcation point:

$$u_{xf1}=\beta_{u1}\beta_{u2}, i_{xf0}=\beta_{i1}\beta_{i2} \quad (9).$$

Namely the primary voltage/current reflected waves from the fault point have the same polarities, both are positive polarity reflection, have similar amplitudes and occur at the same time essentially, amplitudes of the reflected waves are relevant to transition resistance and characteristic impedance, and the secondary reflected wave has characteristics similar to the primary reflected wave.

2) relative values of the secondary voltage/current reflected waves from the demarcation point:

$$u_{xf2}=\beta_{u0}\beta_{u1}, i_{xf2}=\beta_{i0}\beta_{i1} \quad (10).$$

Namely the secondary voltage/current reflected waves from the demarcation point have the same polarities, and occur at the same time essentially and are relevant to the cable length, and amplitudes of the reflected waves are relevant to transition resistance and characteristic impedance; when the fault point is located in the overhead line segment, the secondary reflected waves from the demarcation point are essentially a fixed value. Theoretically, amplitudes of the secondary reflected waves from the demarcation point of the voltage and current should be close to each other, but in actual computation, the secondary reflected waves from the demarcation point are often overlapped with the incident waves, therefore, there is often a certain difference.

EXAMPLES

Application of algorithms will be illustrated below with several typical cases. The data is derived from EMTDC/PSCAD electromagnetic simulation software, and the system model is based on building of 220 kV Luohe transformer substation of Huainan Power Supply Company of Anhui Electric Power Corporation of the State Grid. For ease of explanation, the cable length is properly modified, the cable length is 2.2 km, the length of the overhead line is 23 km, the sampling frequency is 1 MHz. The simulated line employs a frequency-related model, and transient response characteristics of the current/voltage transformer are considered during the simulation process.

Example 1 the fault point is located in the cable segment, and is about 500 m away from the demarcation point, there is a metallic short circuit and the transition resistance is 1 ohm

TABLE 1

| | List of wave heads of transient travelling waves | | | | | |
|---|---|---|---|---|---|---|
| Time of wave head | 1014 | 1021 | 1037 | 1045 | 1059 | 1075 |
| Relative current value | 1 | 0.647339 | 0.24412 | −0.115603 | 0.214174977 | 0.22698 |
| Properties of wave heads | Initial wave head | Reflected wave from the demarcation point | Reflected wave from the fault point | Secondary reflected wave from the demarcation point | | |

TABLE 1-continued

List of wave heads of transient travelling waves

| Time of wave head | 1014 | 1021 | 1028 | 1037 | 1043 | 1052 |
|---|---|---|---|---|---|---|
| Relative voltage value | 1 | 0.669007 | −0.08241 | 0.1737559 | −0.2008121 | 0.716757 |
| Properties of wave heads | Initial wave head | Reflected wave from the demarcation point | | Reflected wave from the fault point | Secondary reflected wave from the demarcation point | |

In Table 1 the time of the initial wave head of fault is 1014, and it is known from the cable length that there is 30 us difference between the secondary reflected wave from the demarcation point and the initial wave head, therefore the size of the timing window is around 30 us. It is known from Table 1 that, when the fault point is located in the cable segment, the reflected wave from the demarcation point and the reflected wave from the fault point can be identified within the timing window, both of which show characteristics of the same polarity and similar amplitudes, and the restriction conditions described in step 5 are satisfied, then it can be determined that the fault is located in the cable segment.

Example 2 the fault point is located in the overhead line segment and is about 5 km away from the demarcation point.

It is known from Table 2 that, when the fault point is located in the overhead line segment, no reflected wave with the same polarity and similar amplitudes is found within the timing window, then it can be determined that the fault is located in the overhead line segment; but primary and secondary reflected waves from the demarcation point and the fault point can be clearly identified after the timing window. Compared to Table 1, the secondary reflected wave from the demarcation point is enhanced obviously, as described previously, in most cases amplitude of the secondary reflected wave from the demarcation point is close to a fixed value, and the value is used as a constant.

Example 3 the fault point is located in the cable segment, and is 200 m away from the demarcation point.

TABLE 2

List of time and amplitudes of wave heads of transient travelling waves

| Time of wave head | 1035 | 1052 | 1064 | 1068 | 1099 | 1108 |
|---|---|---|---|---|---|---|
| Relative current value | 1 | −0.14201 | −0.42156 | 0.43983937 | −0.20023161 | −0.13729 |
| Properties of wave heads | Initial wave head | | Secondary reflected wave from the demarcation point | Primary reflected wave from the demarcation point and the fault point | Secondary reflected wave from the demarcation point and the fault point | |
| Time of wave head | 1035 | 1056 | 1064 | 1069 | 1084 | 1102 |
| Relative voltage value | 1 | 0.045256 | −0.23936 | 0.52618835 | 0.555502993 | 1.400781 |
| Properties of wave heads | Initial wave head | | Secondary reflected wave from the demarcation point | Primary reflected wave from the demarcation point and the fault point | Secondary reflected wave from the demarcation point and the fault point | |

TABLE 3

List of time and amplitudes of wave heads of transient travelling waves

| Time of wave head | 1017 | 1029 | 1040 | 1045 | 1085 | 1096 |
|---|---|---|---|---|---|---|
| Relative current value | 1 | −0.16025 | 0.101191 | 0.12095932 | −0.20238753 | 0.137179 |
| Properties of wave heads | Initial wave head | | | | | |
| Time of wave head | 1017 | 1029 | 1040 | 1045 | 1050 | 1063 |
| Relative voltage value | 1 | −0.17202 | 0.074338 | 0.0918639 | −0.12697323 | 0.391388 |
| Properties of wave heads | Initial wave head | | | | | |

It is known from Table 3 that, when the fault point is located in the cable segment, the fault point is close to the demarcation point, resulting in that the incident wave is overlapped with the reflected wave and reduces amplitude of the secondary reflected wave from the demarcation point, and the secondary reflected wave from the demarcation point which should occur is not found 30 us after the initial wave head of fault.

Example 4 the fault point is located in the cable segment and is 500 m away from the demarcation point, and the transition resistance is 100 ohm.

TABLE 4

List of time and amplitudes of wave heads of transient travelling waves

| Time of wave head | 1014 | 1021 | 1028 | 1037 | 1045 | 1058 |
|---|---|---|---|---|---|---|
| Relative current value | 1 | 0.574772 | −0.09819 | 0.13813954 | −0.17518611 | 0.092815 |
| Properties of wave heads | Initial wave head | Reflected wave from the demarcation point | | Reflected wave from the fault point | Secondary reflected wave from the demarcation point | |
| Time of wave head | 1014 | 1021 | 1028 | 1037 | 1044 | 1052 |
| Relative voltage value | 1 | 0.613742 | −0.09147 | 0.14097836 | −0.18771316 | 0.474296 |
| Properties of wave heads | Initial wave head | Reflected wave from the demarcation point | | Reflected wave from the fault point | Secondary reflected wave from the demarcation point | |

It is known from Table 4 that, when the fault point is located in the cable segment, the secondary reflected wave from the demarcation point which occurs 30 us after the initial wave head of fault has significantly reduced amplitude.

In conclusion, basic principles of the existing section locating method of hybrid line is to utilize a distance component or a double-end fault location manner to perform section locating, but is not widely applied due to restriction of costs, site conditions, disadvantages of algorithm principles and other reasons. Because the main objective of rapid section locating of the hybrid line is to rapidly determine that the fault point is located in the overhead line segment or the cable segment, the rapid section locating method of the invention requires not to precisely locate the fault point but to compare fault characteristics when the fault point is located in the overhead line segment and the cable segment.

In specific application, the above may be adjusted and changed individually by those skilled in the art according to specific circumstances. Above description of the invention is for the preferred examples only, and could not be understood as to limit the content of the invention.

What is claimed is:

1. A fault point locating method of hybrid lines based on analysis of comprehensive characteristics of single-end electric quantity and transient travelling waves, the method comprising:

step 1, performing, by a computing device comprising a processor and a memory, phase-model transformation based on the single-end electric quantity, and reducing effect of inter-phase coupling of the transient travelling waves on section locating;

step 2, utilizing, by the computing device, wavelet transformation to detect a signal break point of transient voltage and current travelling waves as the initial time of failure;

step 3, extracting, by the computing device, timing window data after the initial time of failure of the voltage and current travelling waves, wherein size of the timing window is determined by cable length;

step 4, searching, by the computing device, all reflected wave heads with the same voltage/current polarity and close amplitudes in the timing window, and computing relative values $u_{xf}$ and $i_{xf}$ of various reflected and initial wave heads with the initial wave head of the voltage/current travelling waves as a benchmark;

step 5, judging, by the computing device, properties of the reflected waves;

wherein, in step 5, supposing time of an initial fault wave as $T_0$, time of the reflected wave from the fault point as $T_1$, time of the reflected wave from the demarcation point as $T_2$, the cable length as $L_1$, and the cable wave velocity as $v_1$;

when the fault point is located in the overhead line segment, the condition of the following formula (3) is satisfied:

$$T_1 - T_0 = T_2 - T_0 \qquad (3);$$

when the fault point is located in the cable segment, the condition of the following formula (4) is satisfied:

$$(T_1 + T_2 - 2T_0) * v_1 = L_1 \qquad (4);$$

and automatically switching-ON or switching-OFF of reclosing associated with the hybrid line based upon location of the fault in the overhead line segment and the cable segment, respectively, of the hybrid line.

2. The fault point locating method of hybrid lines based on analysis of comprehensive characteristics of single-end electric quantity and transient travelling waves according to claim 1, wherein, in step 1: with Clarke transformation as a phase-model transformation matrix, obtaining corresponding α modulus in formula (1)

$$i_\alpha(k) = \tfrac{1}{3}(2 * i_A(k) - i_B(k) - i_C(k)) \qquad (1),$$

in formula (1), $i_A(k)$, $i_B(k)$ and $i_C(k)$ are respectively the current of the tree phases of A, B and C in the fault line, $i_\alpha(k)$ is α modulus transformed, k=1, 2, 3, 4 . . . N, in which N is the length of the sampled sequence represented by a natural number, and a voltage transformation matrix is similar to formula (1).

3. The fault point locating method of hybrid lines based on analysis of comprehensive characteristics of single-end electric quantity and transient travelling waves according to claim 1, wherein, in step 3, when the cable length is uncertain or wave velocity is not easy to judge, selecting the secondary reflected wave from the demarcation point to assist in computing size of the timing window.

4. The fault point locating method of hybrid lines based on analysis of comprehensive characteristics of single-end electric quantity and transient travelling waves according to claim 1, wherein, in step 4, both the reflected wave from the fault point and the reflected wave from the demarcation point should satisfy formula (2):

$$u_{xf}/i_{xf} < \delta \qquad (2),$$

δ is a fixed value relevant to transient response of a transformer and has a value between 0.5~2.

5. The fault point locating method of hybrid lines based on analysis of comprehensive characteristics of single-end electric quantity and transient travelling waves according to claim 1, wherein, in step 5, when there are the following two cases, step 6 needs to be performed:

1) when the fault point is close to a bus or the demarcation point, the reflected wave from the fault point or the reflected wave from the demarcation point may be overlapped with an initial fault travelling wave or the secondary reflected wave from the demarcation point;

2) when fault transition resistance is high resistance fault or metallic fault, only one of the reflected wave from the fault point and the reflected wave from the demarcation point can be identified;

Step 6: judging whether the amplitude of the secondary reflected wave from the demarcation point is out-of-limit.

6. The fault point locating method of hybrid lines based on analysis of comprehensive characteristics of single-end electric quantity and transient travelling waves according to claim 5, wherein, in step 6, taking whether difference value between the amplitudes of the secondary reflected waves from the voltage/current demarcation points is out-of-limit as identification criterion, and supposing the amplitudes of the secondary reflected waves from the demarcation points as $C_u$ and $C_i$, and the set difference value between the amplitudes of the secondary reflected waves from the demarcation points as $\delta_u$ and $\delta_i$, the condition of the following formula (5) is satisfied:

$$u_{xf2} - C_u > \delta_u, i_{xf2} - C_i > \delta_i \qquad (5).$$

* * * * *